United States Patent [19]
Bae

[11] Patent Number: 5,849,438
[45] Date of Patent: Dec. 15, 1998

[54] PHASE SHIFT MASK AND METHOD FOR FABRICATING THE SAME

[75] Inventor: Sang Man Bae, Ichon, Rep. of Korea

[73] Assignee: Hyundai Electronics Industries Co., Ltd., Ichon, Japan

[21] Appl. No.: 670,841

[22] Filed: Jun. 28, 1996

[30] Foreign Application Priority Data

Jun. 30, 1995 [KR] Rep. of Korea .................. 95-18883

[51] Int. Cl.[6] .................................................. G03F 9/00
[52] U.S. Cl. .............................................. 430/5; 430/322
[58] Field of Search ............................ 430/5, 322, 323, 430/324

[56] References Cited

U.S. PATENT DOCUMENTS

| | | | |
|---|---|---|---|
| 5,322,749 | 6/1994 | Han | 430/5 |
| 5,328,786 | 7/1994 | Miyazaki et al. | 430/5 |
| 5,366,963 | 11/1994 | Hanyu et al. | 430/5 |
| 5,465,859 | 11/1995 | Chapple-Sokol et al. | 216/12 |
| 5,484,672 | 1/1996 | Bajuk et al. | 430/5 |
| 5,536,603 | 7/1996 | Tsuchiya et al. | 430/5 |

*Primary Examiner*—S. Rosasco
*Attorney, Agent, or Firm*—Reid & Priest LLP

[57] ABSTRACT

A phase shift mask capable of improving the profile of a photoresist film pattern to be formed, thereby achieving an easy formation of micro patterns to fabricate highly-integrated semiconductor devices, and a method for forming the phase shift mask. The phase shift mask includes a transparent substrate, a light shield film pattern formed on the transparent substrate, the light shield film pattern having alternately-arranged lines and spaces respectively having desired dimensions, a first phase shift film pattern formed on the light shield film pattern and provided with alternately-arranged lines and spaces, the first phase shift film pattern having a larger line width than that of the light shield film pattern, and a second phase shift film pattern formed on a portion of the transparent substrate occupied by the spaces of the first phase shift film pattern.

20 Claims, 3 Drawing Sheets

PHASE SHIFT MASK AND METHOD FOR FABRICATING THE SAME

BACKGROUND OF THE INVENTION

1. Field of the Invention

The present invention relates to a phase shift mask and a method for fabricating the same, and more particularly to a phase shift mask capable of improving the contrast ratio between line/space patterns to form micro patterns and a method for fabricating the phase shift mask.

2. Description of the Prior Art

The recent trend to fabricate semiconductor devices with a high integration degree results in a reduced distance between adjacent wirings, an increased topology and a reduced size of unit elements such as transistors or capacitors. For this reason, the necessity to form patterns with a micro dimension has been increased.

Generally, light exposure masks, which are used in the light exposure process for forming photoresist film patterns, are fabricated by coating a light shield film comprised of a chromium layer or aluminum layer over a quartz substrate, and then etching the light shield film in accordance with an ion beam etching method, thereby forming a light shield film pattern.

However, such general light exposure masks are difficult to form patterns with a micro dimension smaller than the limit of the light resolution of steppers. Furthermore, conventional photoresist solutions and steppers, such as G-line steppers with the wavelength of 436 nm or I-line steppers with the wavelength of 365 nm are difficult to form patterns having a micro dimension of about 0.5 $\mu$m or below.

On the other hand, semiconductor devices having a high integration degree of the 64 Mega DRAM grade or greater need a micro pattern with a dimension of 0.5 $\mu$m or below.

In order to form such a micro pattern, phase shift masks capable of forming photoresist film patterns exhibiting a high resolution have been used.

Typically, such phase shift masks have a phase shift film pattern adapted to shift the phase of light through an angle of 180° or 90° along with light shield film patterns so as to uniformly maintain the amplitude of light irradiated onto a wafer in the light exposure process. In other words, such phase shift mask utilize the principle of minimizing the light exposure effect resulting from the interference between the light passing through the phase shift film pattern and the light passing through a pattern disposed adjacent to the phase shift film pattern, thereby improving the resolution of a photoresist film pattern finally formed.

The phase shift film pattern is made of a phase shift material exhibiting a refractivity of n to have a thickness capable of shifting the phase of light with a wavelength of A through an angle of 160° to 200° so that the light irradiated onto a photoresist film can exhibit an increase in contrast ratio.

For example, for G-line or i-line incident light, the phase shift mask may have about 3,400 to 4,000 Å when it is comprised of a spin-on-glass (SOG) film, oxide film, nitride film or cured photoresist film.

When such phase shift masks are used, micro patterns having a dimension of about 0.5 $\mu$m or below may be formed using conventional photoresist solution and steppers. Such phase shift masks are classified into the Levenson type and the edge emphasis type.

An example of a conventional phase shift mask will now be described in conjunction with FIGS. 1 to 3.

Referring to FIG. 1, a phase shift mask 1 is shown, which includes a transparent substrate 2 made of glass or quartz and a light shield film pattern 3 formed on the transparent substrate 2. The Tight shield film pattern 3 has alternately-arranged lines and spaces respectively having uniform dimensions. On the light shield film pattern 3, a phase shift film pattern 4 is formed. The phase shift film pattern 4 has alternately-arranged lines and spaces. The line and space widths of the phase shift film pattern 4 are larger than those of the light shield film pattern 3.

In the phase shift mask 1 having the above-mentioned structure, a 180° phase difference is exhibited between light passing through the phase shift mask pattern 4 and light directly passing through the transparent substrate 2. In other words, electric fields 6 and 7 respectively established by the light passing through the phase shift mask pattern 4 and the light directly passing through the transparent substrate 2 exhibit a 180° phase difference, as shown in FIG. 2.

As a result, the light beams reaching a wafer to be patterned interfere with each other as shown in FIG. 3, thereby improving the image contrast. In this case, however, there is a limitation on the depth of focus or the fineness of the pattern when the wavelength of light is constant. Therefore, it is difficult to form micro patterns with a dimension of about 0.25 $\mu$m or below.

Accordingly, the conventional phase shift masks of the Levenson or edge emphasis type involve a difficulty in the formation thereof and a limitation on the fineness of patterns.

Consequently, the conventional phase shift mask is not suitable for the fabrication of highly-integrated semiconductor devices.

SUMMARY OF THE INVENTION

Therefore, an object of the invention is to solve the above-mentioned problems involved in the prior art and to provide a phase shift mask capable of improving the profile of a photoresist film pattern to be formed, thereby achieving an easy formation of micro patterns to fabricate highly-integrated semiconductor devices, and a method for forming the phase shift mask.

Another object of the invention is to provide a phase shift mask capable of achieving an improvement in process margin, thereby providing an improvement in operation, reliability and process yield.

In accordance with one aspect of the present invention, a phase shift mask comprises, a transparent substrate; a first phase shift film pattern formed on the transparent substrate, the first phase shift film pattern having alternately-arranged lines and spaces respectively having desired dimensions; a light shield film pattern formed on the first phase shift film pattern and provided with alternately-arranged lines and spaces, the light shield film pattern having a smaller line width than that of the first phase shift film pattern; and a second phase shift film pattern formed on a portion of the transparent substrate occupied by the spaces of the first phase shift film pattern.

In accordance with another aspect of the present invention, a phase shift mask comprises: a transparent substrate; a light shield film pattern formed on the transparent substrate, the light shield film pattern having alternately-arranged lines and spaces respectively having desired dimensions; a first phase shift film pattern formed on the light shield film pattern and provided with alternately-arranged lines and spaces, the first phase shift film pattern having a larger line width than that of the light shield film pattern; and a second phase shift film pattern formed on a portion of the transparent substrate occupied by the spaces of the first phase shift film pattern.

In accordance with another aspect of the present invention, a method for forming a phase shift mask, comprises the steps of: preparing a transparent substrate; forming, on the transparent substrate, a first phase shift film pattern having alternately-arranged lines and spaces respectively having desired dimensions; forming, on the first phase shift film pattern, a light shield film pattern having alternately-arranged lines and spaces in such a manner that the light shield film pattern has a smaller line width than that of the first phase shift film pattern; and forming a second phase shift film pattern having alternately-arranged lines and spaces respectively having desired dimensions on a portion of the transparent substrate occupied by the spaces of the first phase shift film pattern.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
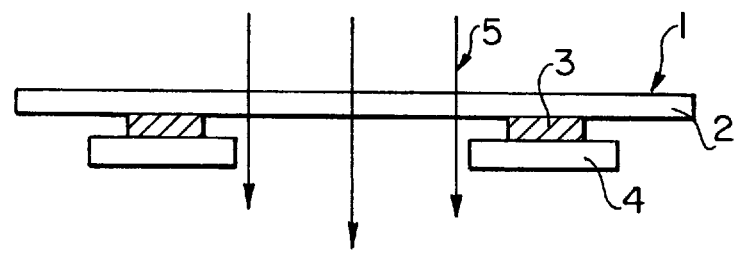
FIG. 1 is a sectional view illustrating a conventional phase shift mask.
Figure 2:
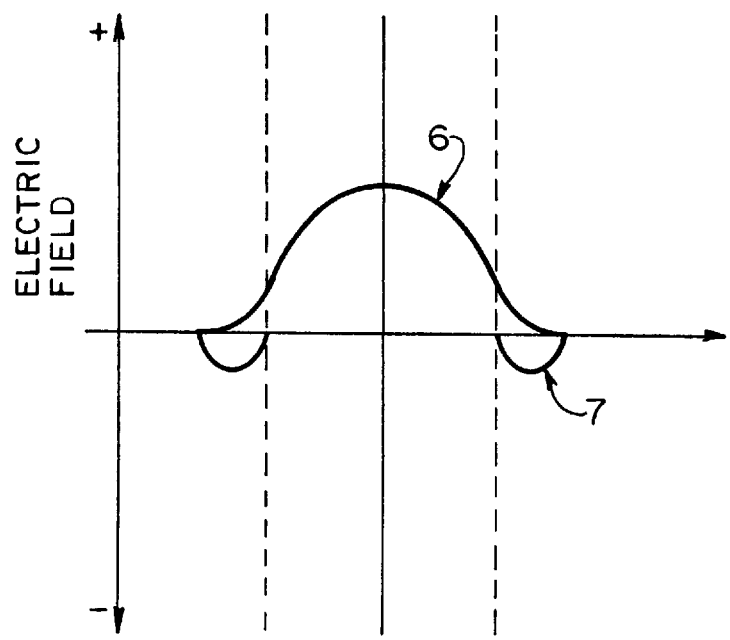
FIG. 2 is a graph showing the electric field intensity depending on the position of the phase shift mask shown in FIG. 1.
Figure 3:
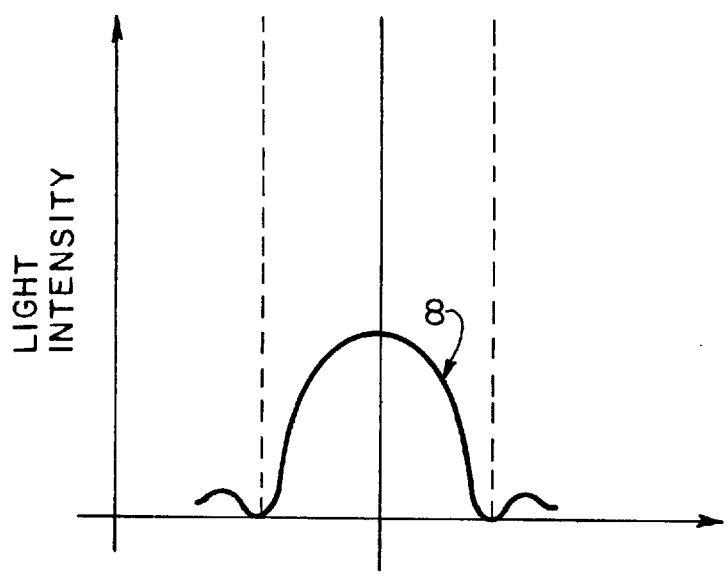
FIG. 3 is a graph showing the light intensity depending on the position of the phase shift mask shown in FIG. 1.
Figure 4:
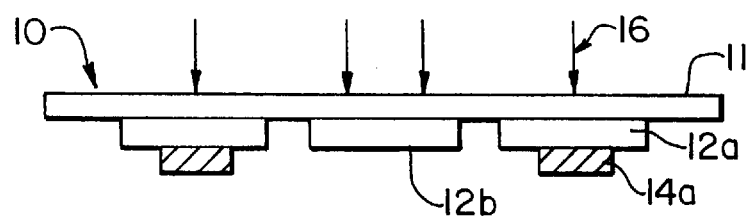
FIG. 4 is a sectional view illustrating a phase shift mask according to the present invention.

FIG. 4 is a sectional view illustrating a phase shift mask according to the present invention.

As shown in FIG. 4, the phase shift mask, which is denoted by the reference numeral 10, includes a transparent substrate 11 made of glass or quartz and a first phase shift film pattern 12a formed on the transparent substrate 11. The first phase shift film pattern 12a has alternately-arranged lines and spaces respectively having uniform dimensions. The first shift film pattern 12a is made of a phase shift material such as SOG, oxide, nitride or cured photoresist material.

The phase shift mask 10 also includes a light shield film pattern 14a formed on the first phase shift film pattern 12a. The light shield film pattern 14a has alternately-arranged lines and spaces. The line width of the light shield film pattern 14a is smaller than that of the first phase shift film pattern 12a whereas the space width of the light shield film pattern 14a is larger than that of the first phase shift film pattern 12a.

The phase shift mask 10 also includes a second phase shift film pattern 12b formed on a portion of the transparent substrate which is occupied by the spaces of the first phase shift film pattern 12a. The second phase shift film pattern 12b has alternately-arranged lines and spaces respectively having uniform dimensions. The lines of the second phase shift film pattern 12b are uniformly spaced from the corresponding lines of the first phase shift film pattern 12a. The second shift film pattern 12b is made of a phase shift material such as SOG, oxide, nitride or cured photoresist material. The first and second shirt film patterns 12a and 12b construct a double edge emphasis type phase shift mask structure.

Figure 5:
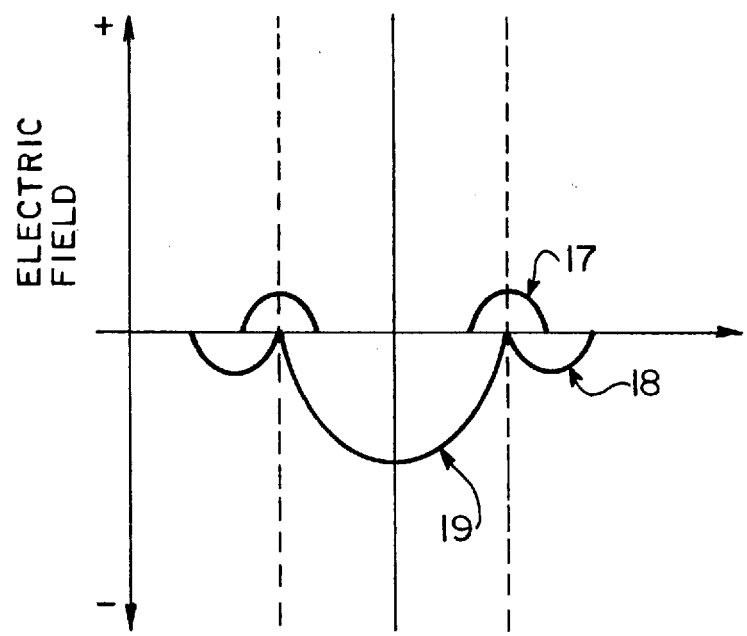
FIG. 5 is a graph showing the electric field intensity depending on the position of the phase shift mask shown in FIG. 4.
Figure 6:
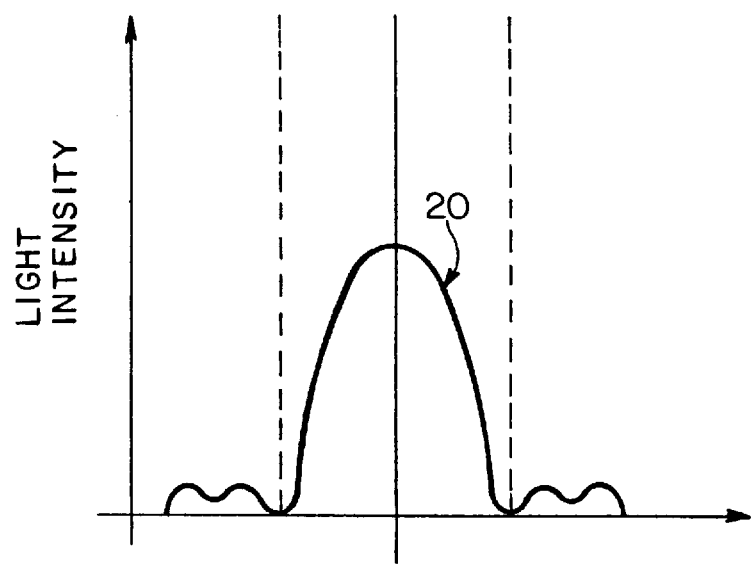
FIG. 6 is a graph showing the light intensity depending on the position of the phase shift mask shown in FIG. 4.

In the phase shift mask 10 having the above-mentioned structure, incident light beams 16 establish electric fields 18 and 19 involving a 180° phase shift when they pass through the first and second phase shift film patterns 12a and 12b, as shown in FIG. 5. On the other hand, light beams directly passing through portions of the transparent substrate 11 between the first and second phase shift film patterns 12a and 12b establish an electric field 17 involving a 0° phase shift. Due to such electric fields, the graph, 20, indicating the intensity of the transmitting light involves a sharp edge gradient, As a result, an improvement in image contrast is obtained.

In the illustrated case, the first and second phase shift film patterns 12a and 12b have the same line/space width. In some cases, the line/space widths of the phase shift film patterns 12a and 12b may be optionally varied.

Although the light shield film pattern 14a is arranged on the first phase shift film pattern 12a in the illustrated case, it may be arranged beneath the first phase shift film pattern 12a. In this case, the same effect is also obtained.

Figure 7A:
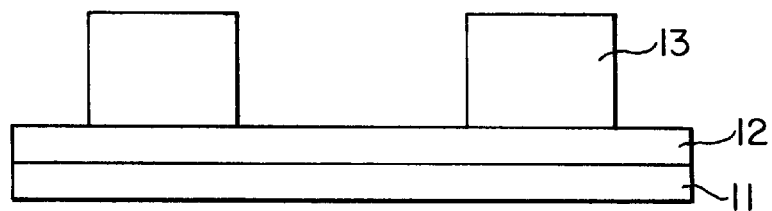
FIGS. 7A to 7C are sectional views respectively illustrating a method for fabricating a phase shift mask in accordance with the present invention.
Figure 7B:
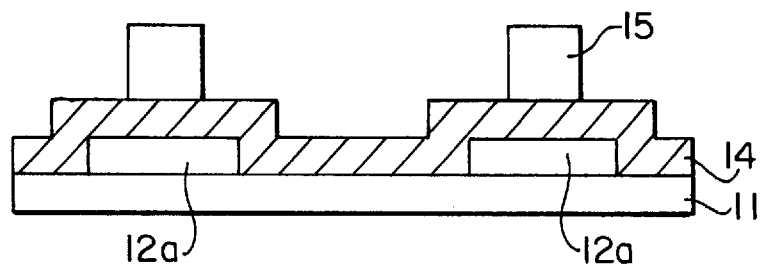
Figure 7C:
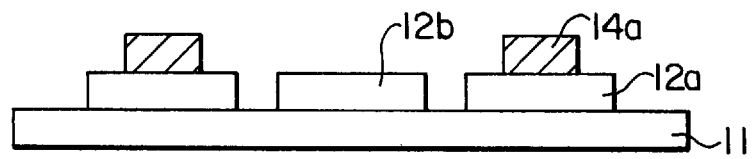

FIGS. 7A to 7C illustrate sequential steps of a method for fabricating the phase shift mask according to the present invention, respectively. In FIGS. 7A to 7C, elements respectively corresponding to those in FIG. 4 are denoted by the same reference numerals.

In accordance with this method, a first phase shift film 12 made of a phase shift material such as SOG, oxide, nitride or cured photoresist material is first coated over a transparent substrate 11, as shown in FIG. 7A. A first photoresist film pattern 13, which has a desired line/space pattern, is then formed on the first phase shift film 12.

Thereafter, the exposed portion of the first phase shift film 12 not covered by the first photoresist film pattern 13 is partially removed, thereby forming a first phase shift film pattern 12a having a desired line/apace pattern, as shown in FIG. 7B. The first photoresist film pattern 13 is then removed. Over the resulting structure, a photo shield film 14 made of chromium is then coated. Subsequently, a second photoresist film pattern 15 is coated on a portion of the light shield film 14 disposed over the first phase shift film pattern 12a. The second photoresist film pattern 15 has a line width smaller than that of the first photoresist film pattern 13.

The exposed portion of the light shield film 14 not covered with the second photoresist film pattern 15 is partially removed, thereby forming a light shield film pattern 14a having a desired line/space pattern, as shown in FIG. 7C. The light shield film pattern 14a has a line width smaller than that of the first phase shift film pattern 12a. The second photoresist film pattern 15 is then removed.

Finally, a second phase shift film pattern 12b is formed on a portion of the transparent substrate 11 which is occupied by the spaces of the first phase shift film pattern 12a by carrying out the same processing steps as those in the formation of the first phase shift film pattern 12a. Thus, a double edge emphasis type phase shift mask 10 is obtained.

The formation of the first and second photoresist film patterns 13 and 15 is carried out using a well-known stepper or E-beam stepper.

Preferably, the transparent substrate 11 has an exposed portion having a desired width between the first and second phase shift film patterns 12a and 12b.

The first and second phase shift film patterns 12a and 12b have a thickness sufficient to shift the phase of light through an angle of 180°.

Although the light shield film pattern 14a is formed on the first phase shift film pattern 12a in the illustrated case, it may be arranged beneath the first phase shift film pattern 12a. In this case, the light shield film pattern 14a is formed prior to the formation of the first phase shift film pattern 12a. This first phase shift film pattern 12a is then formed on the light shield film pattern 14a to have a larger width than the light shield film pattern 14a. In this case, the light shield film pattern 14a should have undercut portions beneath the first phase shift film pattern 12a.

When the first and second phase shift film patterns are comprised of a cured photoresist film, instead of an SOG, oxide or nitride film, there is no requirement to form any separate photoresist film patterns for the patterning thereof. In this case, accordingly, the entire fabrication becomes simple.

As apparent from the above description, the present invention provides a phase shift mask with a double edge emphasis type phase shift structure consisting of a first phase shift film pattern formed on a transparent substrate and a second phase shift film pattern formed on a portion of the transparent substrate occupied by spaces of the first phase shift film pattern in such a manner that the transparent substrate has an exposed portion having a desired width between the first and second phase shift film patterns.

In the phase shift mask, light passing through the first and second phase shift film patterns interferes with light directly passing through the transparent substrate between the first and second phase shift film patterns. By virtue of this light interference, the light intensity graph involves a sharp gradient at its edge portion. Accordingly, an improvement in light contrast is achieved.

Therefore, it is possible to improve the profile of a photoresist film pattern, thereby achieving an easy formation of micro patterns to fabricate highly-integrated semiconductor devices. An improvement in process margin is also obtained, thereby providing an improvement in operation, reliability and process yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask, comprising:

a transparent substrate;

a first phase shift film pattern formed directly on said transparent substrate, the first phase shift film pattern having alternately-arranged lines and spaces having respective desired dimensions;

a light shield film pattern formed directly on said first phase shift pattern and not on said transparent substrate, and provided with alternately-arranged lines and spaces, the light shield film pattern having a smaller line width than a line width of said first phase shift film pattern; and a second phase shift film pattern formed directly on said transparent substrate on a portion of said transparent substrate occupied by the spaces of said first phase shift film pattern, the second phase shift film pattern occupying less than all the spaces of said first phase shift film pattern.

2. The phase shift mask in accordance with claim 1, wherein said light shield film pattern is made of chromium.

3. The phase shift mask in accordance with claim 1, wherein said first and second phase shift film patterns are comprised of a spin-on-glass film.

4. The phase shift mask in accordance with claim 1, wherein said first and second phase shift film patterns are comprised of an oxide film.

5. The phase shift mask in accordance with claim 1, wherein said first and second phase shift film patterns are comprised of a nitride film.

6. The phase shift mask in accordance with claim 1, wherein said first and second phase shift film patterns are comprised of a cured photoresist film.

7. A phase shift mask, comprising:

a transparent substrate;

a light shield film pattern formed directly on said transparent substrate, the light shield film pattern having alternately-arranged lines and spaces having respective desired dimensions;

a first phase shift film pattern formed directly on said light shield film pattern and provided with alternately-arranged lines and spaces, the first phase shift film pattern having a larger line width than a line width of said light shield film pattern; and a second phase shift film pattern formed directly on said transparent substrate on a portion of said transparent substrate occupied by the spaces of said first phase shift film pattern, the second phase shift film pattern occupying less than all the spaces of said first phase shift film pattern.

8. The phase shift mask in accordance with claim 7, wherein said light shield film pattern is made of chromium.

9. The phase shift mask in accordance with claim 7, wherein said first and second phase shift film patterns are comprised of a spin-on-glass film.

10. The phase shift mask in accordance with claim 7, wherein said first and second phase shift film patterns are comprised of an oxide film.

11. The phase shift mask in accordance with claim 7, wherein said first and second phase shift film patterns are comprised of a nitride film.

12. The phase shift mask in accordance with claim 7, wherein said first and second phase shift film patterns are comprised of a cured photoresist film.

13. A method for forming a phase shift mask, comprising:

preparing a transparent substrate;

forming a first phase shift film pattern directly on said transparent substrate, the first phase shift film pattern having alternately-arranged lines and spaces having respective desired dimensions;

forming a light shield film pattern directly on the first phase shift film pattern and not directly on the transparent substrate, the light shield film pattern having alternately-arranged lines and spaces in such a manner that said light shield film pattern has a smaller line width than that of said first phase shift film pattern; and forming a second phase shift film pattern having alternately-arranged lines and spaces having respective desired dimensions directly on said transparent substrate on a portion of said transparent substrate occupied by the spaces of said first phase shift film pattern, the second phase shift film pattern occupying less than all the spaces of said first phase shift film pattern.

14. The method in accordance with claim 13, wherein said light shield film pattern is made of chromium.

15. The method in accordance with claim 13, wherein said first and second phase shift film patterns are comprised of a spin-on-glass film.

16. The method in accordance with claim 13, wherein said first and second phase shift film patterns are comprised of an oxide film.

17. The method in accordance with claim 13, wherein said first and second phase shift film patterns are comprised of a nitride film.

18. The method in accordance with claim 13, wherein the first and second phase shift film patterns are comprised of a cured photoresist film.

19. The method in accordance with claim 13, wherein the steps of respectively forming said first and second phase shift film patterns and said light shield film pattern are carried out using a photoresist film pattern as a mask.

20. The method in accordance with claim 19, wherein said photoresist film pattern is formed using an E-beam stepper.

* * * * *